United States Patent
Braun

(10) Patent No.: US 8,912,833 B2
(45) Date of Patent: Dec. 16, 2014

(54) DEVICE AND METHOD FOR PULSE WIDTH MODULATION

(75) Inventor: Christoph Braun, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1155 days.

(21) Appl. No.: 11/673,021

(22) Filed: Feb. 9, 2007

(65) Prior Publication Data
US 2007/0194827 A1    Aug. 23, 2007

(30) Foreign Application Priority Data

Feb. 9, 2006   (DE) .......................... 10 2006 006 083

(51) Int. Cl.
| | |
|---|---|
| H03K 3/017 | (2006.01) |
| H04L 25/49 | (2006.01) |
| H03F 3/217 | (2006.01) |
| H03K 7/08 | (2006.01) |
| H03M 3/00 | (2006.01) |

(52) U.S. Cl.
CPC .............. *H03K 7/08* (2013.01); *H04L 25/4902* (2013.01); *H03F 2200/351* (2013.01); *H03F 3/217* (2013.01); *H03F 2200/331* (2013.01); *H03M 3/506* (2013.01)
USPC ............................ 327/172; 327/176; 375/238

(58) Field of Classification Search
None
See application file for complete search history.

(56) References Cited

U.S. PATENT DOCUMENTS

| | | | | |
|---|---|---|---|---|
| 5,933,453 | A * | 8/1999 | Lewison | 375/238 |
| 6,970,503 | B1 * | 11/2005 | Kalb | 375/238 |
| 7,327,188 | B2 * | 2/2008 | Wang et al. | 330/10 |
| 2004/0165661 | A1 * | 8/2004 | Braun | 375/238 |
| 2005/0157159 | A1 | 7/2005 | Komiya et al. | |

FOREIGN PATENT DOCUMENTS

| | | |
|---|---|---|
| DE | 103 27 620 | 8/2004 |
| DE | 10327620 | 8/2004 |
| EP | 0573472 | 4/1999 |
| WO | 2004/102792 | 11/2004 |
| WO | 2004102792 | 11/2004 |

* cited by examiner

*Primary Examiner* — An Luu
(74) *Attorney, Agent, or Firm* — Dicke, Billig & Czaja, PLLC

(57) ABSTRACT

A device and a method for pulse width modulation is disclosed, wherein the temporal occurrence of both the respectively rising and the respectively falling edges of a pulse signal is varied.

17 Claims, 2 Drawing Sheets

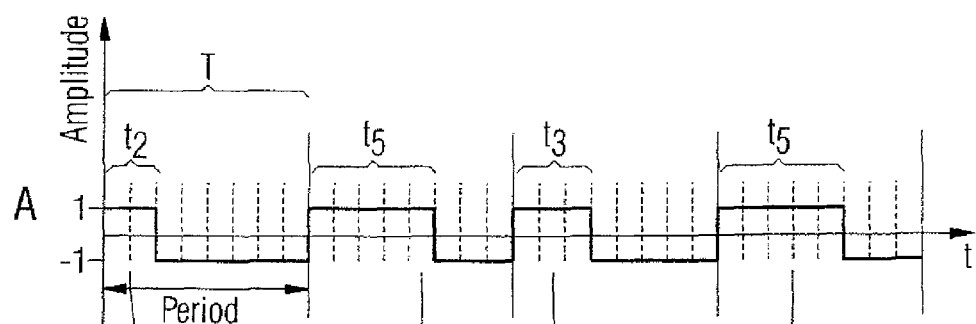
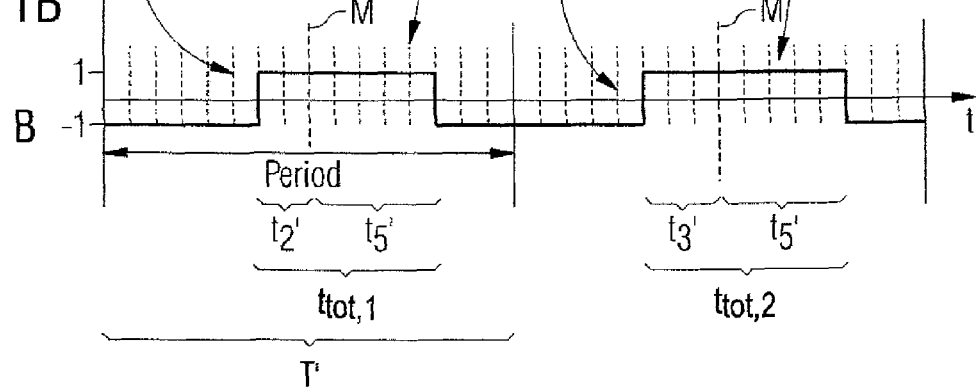

DEVICE AND METHOD FOR PULSE WIDTH MODULATION

CROSS-REFERENCE TO RELATED APPLICATIONS

This Utility Patent Application claims priority to German Patent Application No. DE 10 2006 006 083.0 filed on Feb. 9, 2006, which is incorporated herein by reference.

BACKGROUND

The invention relates to a device and a method for pulse width modulation.

Modulation is the change of signal parameters of a carrier as a function of a signal to be modulated (base band signal).

Demodulation is a further modulation process that serves to retrieve the base band signal.

In a typical configuration of a communication system, a correspondingly modulated signal (modulation product) is generated by a modulator provided at a corresponding terminal by modulation from a carrier and a signal—originating from a source—to be modulated. This modulated signal is, via a communication channel, transmitted to a demodulator provided at a further terminal.

The demodulator transmits a signal generated from the modulated signal by demodulation—i.e. the retrieved base band signal—to a drain provided at the further terminal.

Alternatively, both a source and a drain each may be provided at the terminal and the further terminal; such terminals then include both a modulator and a demodulator, or a modem (modulator/demodulator), respectively.

As a carrier for the modulation, appropriate sinusoidal oscillations (sinusoidal carriers) may be used, or—to an increasing degree—pulse carriers.

In the case of sinusoidal carriers, the following signal parameters may be influenced for modulation: amplitude, frequency, zero phase, etc., and in the case of pulse carriers the signal parameters pulse amplitude, pulse frequency, pulse phase, pulse duration (pulse width).

Pulse duration or pulse width modulation methods (PDM or PWM methods) are used in entertainment electronics, e.g., for the modulation of audio and video signals.

Conventional digital pulse width modulators require a relatively high temporal resolution of the pulse widths, which necessitates e.g., a clock frequency of approx. 100 MHz in the case of audio signals in the range of 0 to 20 kHz.

A known method for digital pulse width modulation is described in Jorge Varona, ECE University of Toronto: "Power Digital to Analog Conversion Using Sigma Delta and Pulse Width Modulations".

A disadvantage is in particular the relatively high circuitry effort.

DE 10350336.6, U.S. Ser. No. 10/976,074, Infineon Technologies, inventor: Ch. Braun, describes a pulse width modulation method in which a pulse width modulated signal is used as a feedback signal in a digital loop, and is thus linearized.

With a corresponding pulse width modulated signal, a class-D amplifier may be triggered. The power consumption of a class-D amplifier is higher, the higher the pulse frequency of the pulse width modulated signal.

For this reason, the pulse frequency of the pulse width modulated signal should be as low as possible.

Conventionally, low pulse frequencies can be realized with a relatively high circuitry effort only.

For these and other reasons, there is a need for the present invention.

SUMMARY

One embodiment provides a method for pulse width modulation defining a pulse signal having rising edges and falling edges. In one embodiment, the method includes varying a temporal occurrence of both the rising edges, and the respective falling edges of the pulse signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic representation of a time progression of a pulse width modulated pulse signal that was modulated in accordance with a conventional method for pulse width modulation, and of a pulse width modulated pulse signal that was modulated in accordance with an embodiment of a method for pulse width modulation according to the present invention.

DETAILED DESCRIPTION

Figure 2:
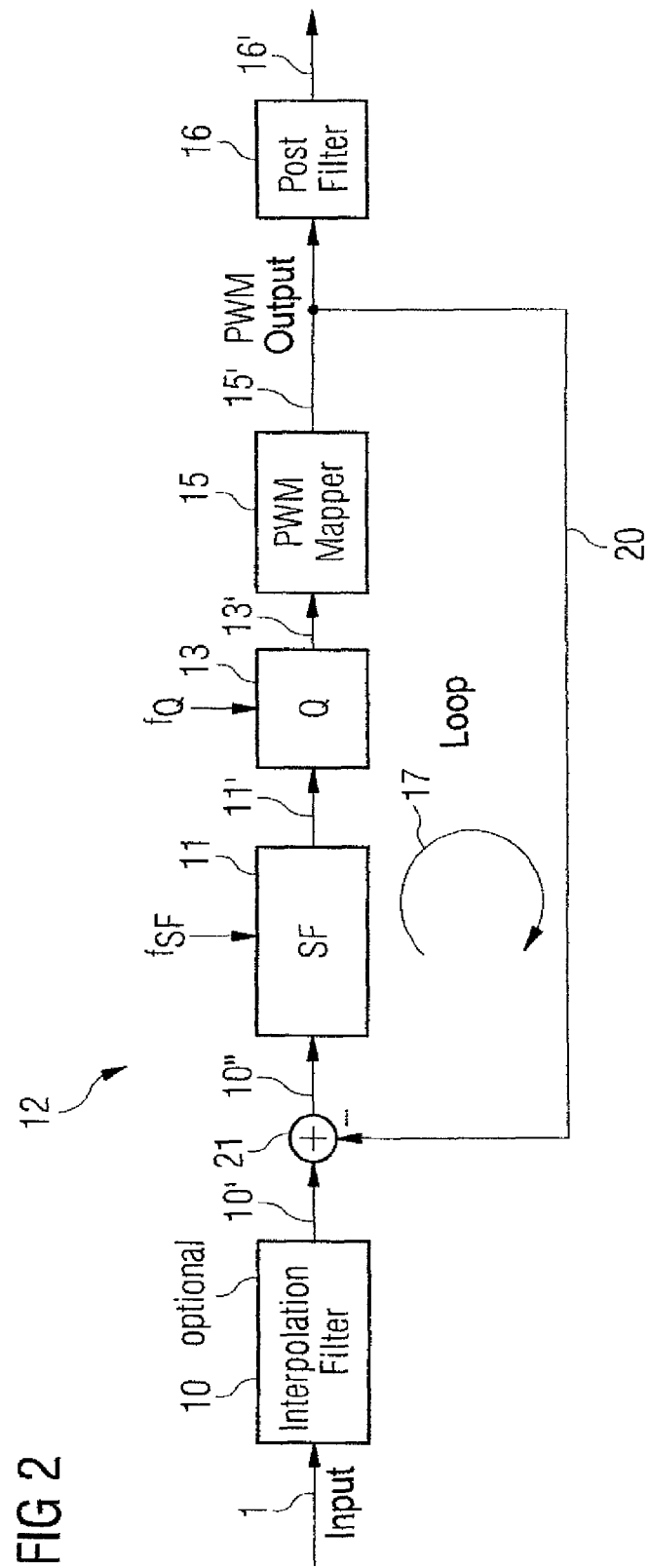
FIG. 2 illustrates a schematic block diagram of a PWM system with a PWM mapper using a method for pulse width modulation.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a device and a method for pulse width modulation by which the above-mentioned and/or further disadvantages of conventional devices and methods can—at least partially—be eliminated or avoided, in particular a device and a method by which the pulse frequency of a pulse width modulated signal can be lowered with relatively little effort.

In accordance with one embodiment of the invention there is provided a method for pulse width modulation in which the temporal occurrence of both the respectively rising and the respectively falling edges of a pulse signal (B) is varied.

In one embodiment, the method includes:
  generating a first, in particular conventional pulse width modulated pulse signal (A), and
  generating a pulse signal (B) in which the temporal occurrence of both the respectively rising and the respectively falling edges is varied, from the first pulse width modulated pulse signal (A).

The period duration (T) of the first—conventional—pulse width modulated pulse signal (A) is shorter than the period duration (T') of the pulse signal (B), e.g., half as long.

In one embodiment of the invention, during the generation of the pulse signal (B) from the first—conventional—pulse width modulated pulse signal (A), a pulse of the first pulse width modulated pulse signal (A) can be temporally mirrored.

During the generation of a pulse of the pulse signal (B), the temporally mirrored pulse of the first pulse width modulated pulse signal (A) and the—non-mirrored—pulse preceding or following the pulse of the first pulse width modulated pulse signal (A) are used.

Due to the relatively long period duration (T') and thus the relatively low pulse frequency of the generated pulse signal (B), the power consumption of an amplifier triggered by the pulse signal (B) can be kept relatively small with relatively little effort.

In accordance with a further embodiment of the invention there is provided a device or a system for pulse width modulation by which the temporal occurrence of both the respectively rising and the respectively falling edges of a pulse signal (B) is varied.

The system additionally includes means for the feedback of a generated pulse signal (B) in a loop, as well as filter and quantizer for quantizing a signal output by the filter.

In the upper region of FIG. 1, a time progression of a pulse width modulated pulse signal A is illustrated, which was modulated in accordance with a conventional method for pulse width modulation.

As results from FIG. 1, the pulse width modulated pulse signal A includes—depending on the respective digital data value to be transmitted—respectively different pulse durations or pulse widths (in the example illustrated in FIG. 1, initially a pulse width t2, then a pulse width t5, subsequently a pulse width t3, next—again—a pulse width t5, etc.).

To each pulse width a corresponding digital data value—to be transmitted—may be assigned (e.g., to a first pulse width a digital data value "001", to a second pulse width t2 a digital data value "010", to a third pulse width t3 a digital data value "011", to a fourth pulse width t4 a digital data value "100", to a fifth pulse width t5 a digital data value "101", etc.).

As results further from FIG. 1, one pulse is generated per period with conventional methods for pulse width modulation, and the temporal occurrence of the respectively falling edges of the pulse signal A is varied—the rising edges follow each other in predetermined, constant time intervals, wherein the time interval between two successive rising edges corresponds to the duration T of one period.

The pulse signal A illustrated in FIG. 1 and modulated in accordance with a conventional method for pulse width modulation includes a relatively short period duration T, and thus a relatively high pulse frequency f.

In the lower region of FIG. 1, the time progression of a pulse width modulated pulse signal B is illustrated, which was modulated in accordance with an embodiment of a method for pulse width modulation according to the present invention.

As results from FIG. 1, the pulse width modulated pulse signal B includes—depending on the respective digital data values to be transmitted, and as will be explained in more detail in the following—respectively different pulse durations or pulse widths.

In correspondence with conventional methods for pulse width modulation, one pulse is generated per period—as results from FIG. 1.

However—other than with conventional methods for pulse width modulation—, not just the temporal occurrence of the respectively falling edges of the pulse signal B is varied, but—additionally—the temporal occurrence of the respectively rising edges of the pulse signal B (other than with conventional methods, neither the rising nor the falling edges follow each other in predetermined, constant time intervals.

Respectively different digital data values—to be transmitted—are assigned to the respectively different time intervals between a rising edge of the pulse signal B and the middle of the period M (e.g., a digital data value "001" to a first time interval between the rising edge and the middle of the period M, a digital data value "010" to a second time interval t2' between the rising edge and the middle of the period M, a digital data value "011" to a third time interval t3' between the rising edge and the middle of the period M, a digital data value "100" to a fourth time interval between the rising edge and the middle of the period M, a digital data value "101" to a fifth time interval t5' between the rising edge and the middle of the period M, etc.).

Correspondingly, respectively different digital data values to be transmitted are—also—assigned to the respectively different time intervals between the middle of the period M and a falling edge of the pulse signal B (e.g., a digital data value "001" to a first time interval between the middle of the period M and the falling edge, a digital data value "010" to a second time interval t2' between the middle of the period M and the falling edge, a digital data value "011" to a third time interval t3' between the middle of the period M and the falling edge, a digital data value "100" to a fourth time interval between the middle of the period M and the falling edge, a digital data value "101" to a fifth time interval t5' between the middle of the period M and the falling edge, etc.).

The time interval between two successive middles of the period M corresponds to the duration T' of a period.

In one embodiment illustrated in FIG. 1, a pulse is first of all transmitted, the rising edge of which has a time interval t2' to the middle of the period M, and the falling edge a time interval t5' (i.e. the digital data values "010" and "110" assigned to the respective time intervals t2' or t5', respectively).

The (total) pulse width of the (first) pulse then is $t_{tot,1} = t2' + t5'$.

Subsequently, a (second) pulse is transmitted, the rising edge of which has a time interval t3' to the middle of the period M, and the falling edge a time interval t5' (i.e. the digital data values "011" and "110" assigned to the respective time intervals t3' or t5', respectively).

The (total) pulse width of the (second) pulse then is $t_{tot,2} = t3' + t5'$.

As results from FIG. 1, the pulse signal B—modulated in accordance with an embodiment of a method for pulse width modulation according to the present invention and illustrated in the lower region of FIG. 1—includes a relatively long period duration T', and thus a relatively low pulse frequency f' (in particular a period duration T' that is twice as long, or a pulse frequency f' that is half as high as that of a corresponding pulse signal A modulated in accordance with a conventional method for pulse width modulation and illustrated in the upper region of FIG. 1).

For generating the pulse signal B—modulated in accordance with an embodiment of a method for pulse width modulation according to the present invention and illustrated in the lower region of FIG. 1—, the—conventional—pulse width modulated pulse signal A illustrated in the upper region of FIG. 1 may first of all be generated—e.g., by an appropriate PWM mapper 15 illustrated in FIG. 2, using a conventional pulse width modulation method.

Subsequently, every second pulse of the—conventionally generated—pulse width modulated pulse signal A may be subjected to temporal mirroring.

This way from the first pulse of the pulse width modulated pulse signal A—the falling edge of which has a time interval t2 to the beginning of the first period of the pulse signal A (pulse width t2)—, a—temporally mirrored—pulse is generated which has a rising edge whose time interval t2' at the end of the first period of the pulse signal A corresponds to the time interval t2 of the first pulse of the pulse width modulated pulse signal A at the beginning of the first period of the pulse signal A.

Correspondingly from the third pulse of the pulse width modulated pulse signal A—the falling edge of which has a time interval t3 to the beginning of the third period of the pulse signal A (pulse width t3)—, a—temporally mirrored—pulse is generated which has a rising edge whose time interval t3' at the end of the third period of the pulse signal A corresponds to the time interval t3 of the third pulse of the pulse width modulated pulse signal A at the beginning of the third period of the pulse signal A, etc.

For generating a pulse of the pulse signal B—modulated in accordance with an embodiment of a method for pulse width modulation according to the present invention and illustrated in the lower region of FIG. 1—, a—temporally mirrored—pulse generated in the above-mentioned manner of the—conventional—pulse width modulated pulse signal A is used, and a following (or alternatively: preceding)—non-mirrored—pulse of the—conventional—pulse signal A.

The respective—mirrored—and the respective following (or preceding)—non-mirrored—pulse are consistently composed to form a corresponding pulse of the pulse signal B—modulated in accordance with an embodiment of a method for pulse width modulation according to the present invention and illustrated in the lower region of FIG. 1—(e.g., a mirrored pulse obtained from the first pulse of the—conventional—pulse signal A, and the following—non-mirrored—second pulse of the—conventional—pulse signal A to a first pulse of the pulse signal B; a mirrored pulse obtained from the third pulse of the—conventional—pulse signal A and the following—non-mirrored—fourth pulse of the—conventional—pulse signal A to a second pulse of the pulse signal B, etc.).

FIG. 2 illustrates a schematic, exemplary block diagram of a PWM system 12 with a PWM mapper 15 in which a method for pulse width modulation in accordance with the present invention can be used.

As results from FIG. 2, an interpolation 10, e.g., an interpolation filter, may—optionally—be provided in the PWM system 12, by which a digital input signal 1 is processed to a digital loop input signal 10'.

The digital loop input signal 10' is fed to a summation element 21.

By the summation element 21, a loop feedback signal 20 is subtracted from the digital loop input signal 10', and the resulting signal 10" is fed to a filter 11.

The filter 11 is operated at a filter sample rate fSF and outputs a filter output signal 11' that is fed to a quantizer 13.

By the filter 11 and the quantizer 13, a modified sigma-delta modulator is formed.

By the quantizer 13, the filter output signal 11' at the output of the filter 11 is quantized in the amplitude.

The quantizer 13 is, compared with the filter 11, operated at an independent quantizing sample rate fQ.

An output signal 13' of the quantizer 13 is converted by the above-mentioned PWM mapper 15 and in the above-mentioned manner to a pulse signal 15'—modulated in accordance with an embodiment of a method for pulse width modulation according to the present invention (in particular a pulse width modulated pulse signal B illustrated in the lower region of FIG. 1, in which—as explained above—the temporal occurrence of both the respectively rising and the respectively falling edges is varied).

As has already been mentioned, the quantizer 13 operates at a different sample rate fQ than the filter 11.

The ratio between the sample rate fSF of the filter 11 and the sample rate fQ of the quantizer 13 results from the resolution of the pulse signal 15' or B, respectively, generated by the PWM mapper 15 as $2^N$=fSF/fQ (wherein N corresponds to the number of bits of the quantizer 13, or $2^N$ to the number of the possible time intervals t2', t3', t5', etc. between the rising or falling edges of the pulse signal 15' or B, respectively, and the middle of the period M (cf. also FIG. 1, lower region)).

As results from FIG. 2, the pulse signal 15' generated by the PWM mapper 15 is fed to the above-mentioned summation element 21 in negated form (i.e. serves as loop feedback signal 20 of the loop 17 including the filter 11, the quantizer 13, and the PWM mapper 15).

Furthermore, the pulse signal 15' generated by the PWM mapper 15 may be fed to a downstream (not illustrated) amplifier, e.g., a class-D amplifier, and subsequently to a post filter 16 that generates a corresponding output signal 16'.

By the—as explained—relatively long period duration T', and thus the relatively low pulse frequency f' of the pulse signal 15' or B, respectively, generated by the PWM mapper 15, the power consumption of the amplifier triggered by the pulse signal 15' or B, respectively, can be kept relatively small with relatively little effort.

By the loop 17, a reduction of signal distortions caused by the merging of a respective mirrored and a respective non-mirrored pulse in the PWM mapper 15 can be achieved.

Instead in the PWM mapper 15 illustrated in FIG. 2, the above-explained method for pulse width modulation in accordance with the present invention may be used in any further PWM mapper and/or any further PWM systems, e.g., in the PWM mapper and/or PWM systems described in DE 10350336.6, U.S. Ser. No. 10/976,074, Infineon Technologies, inventor: Ch. Braun, etc.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for pulse width modulation comprising:
   generating a first pulse width modulated pulse signal; and
   generating a second pulse width modulated pulse signal from said first pulse width modulated pulse signal, wherein for generating one single pulse of said second pulse width modulated pulse signal a first and a second pulse of the first pulse width modulated pulse signal are merged such that a time duration of a logic high state of the one single pulse of said second pulse width modulated pulse signal corresponds to the sum of a time duration of a logic high state of the first pulse of the first pulse width modulated pulse signal and a time duration of a logic high state of the second pulse of the first pulse width modulated pulse signal.

2. The method according to claim 1, comprising wherein a period duration of the first pulse width modulated pulse signal is half as long as the period duration of the second pulse width modulated signal.

3. The method according to claim 1, comprising wherein generation of the second pulse width modulated signal from the first pulse width modulated pulse signal includes temporally mirroring one of the first and second pulses of the first pulse width modulated signal.

4. The method according to claim 3, wherein generation of a pulse of the second pulse width modulated signal includes merging the temporally mirrored pulse of the first pulse width modulated pulse signal and the pulse preceding or following the temporally mirrored pulse of the first pulse width modulated pulse signal.

5. The method according to claim 3, wherein generation of the second pulse width modulated signal from the first pulse width modulated pulse signal, every second pulse of the first pulse width modulated pulse signal is temporally mirrored.

6. A device including pulse width modulation comprising:
a pulse width modulator system comprising:
means for merging a first and a second pulse of a first pulse width modulated pulse signal to generate one single pulse of a second pulse width modulated pulse signal such that a time duration of a logic low state of the one single pulse of said second pulse width modulated pulse signal corresponds to the sum of a time duration of a logic low state of the first pulse of the first pulse width modulated pulse signal and a time duration of a logic low state of the second pulse of the first pulse width modulated pulse signal.

7. The device according to claim 6, comprising:
wherein a period duration of the first pulse width modulated pulse signal is half as long as the period duration of the second pulse width modulated signal.

8. The device according to claim 6, wherein the means for merging the two pulses of the first pulse width modulated pulse signal includes temporally mirroring one of the first and second pulses of the first pulse width modulated signal.

9. A system comprising:
a device for pulse width modulation configured to provide a pulse width modulated output signal having a varied temporal occurrence of both the rising edges and the falling edges of pulses thereof, the device comprising a merger to merge a first and a second pulse of a pulse width modulated pulse signal for generating one single pulse of the pulse width modulated output signal such that a logic high state of the one single pulse of the pulse width modulated output signal has a time duration corresponding to the sum of a time duration of a logic high state of the first pulse of the pulse width modulated pulse signal and a time duration of a logic high state of the second pulse of the pulse width modulated pulse signal; and
a feedback system configured for feeding back the pulse width modulated output signal in a loop.

10. The system of claim 9, comprising:
a filter, and
a quantizer for quantizing a signal output by the filter means.

11. The system of claim 10, comprising wherein the device for pulse width modulation generates the pulse signal from a quantized signal generated by the quantizer.

12. The system of claim 9, where the device for pulse width modulation comprises a PWM mapper.

13. The system of claim 9, comprising:
a post filter, where the pulse width modulated output signal is input to the post filter.

14. The system of claim 9, comprising:
an amplifier, where the pulse width modulated output signal is input to the amplifier.

15. The system of claim 9, comprising:
an interpolation filter configured to receive an input signal, and provide an output signal to the device.

16. The system of claim 15, comprising:
a modified sigma-delta modulator, configured to receive an input signal based on an output signal from the interpolation filter and a feedback signal from the feedback system, and provide a modulated output signal to the device.

17. A method of pulse width modulation comprising:
generating a first pulse width modulated signal having a period duration and comprising a series of pulses having rising edges with a temporal occurrence at a beginning of the period and falling edges having a varying temporal occurrence;
temporally mirroring alternating pulses of the series of pulses of the first pulse width modulated signal; and
merging each temporally mirrored pulse of the first pulse width modulated signal with the immediately preceding or the immediately following pulse of the series to form a second pulse width modulated signal, wherein pulses of the second pulse width modulated signal have rising and falling edges with varying temporal occurrences and a period duration twice that of the period duration of pulses of the first pulse width modulated signal, and wherein a time duration of a logic high state of pulses of the second pulse width modulated signal correspond to a sum of a time duration of logic high states of the corresponding temporally mirrored pulse and the immediately preceding or the immediately following pulse of the first pulse width modulated signal.

* * * * *